United States Patent [19]

Brust

[11] Patent Number: 4,972,142

[45] Date of Patent: Nov. 20, 1990

[54] AUTOMATIC FREQUENCY FOLLOW-UP IN PARTICLE BEAM METROLOGY UPON EMPLOYMENT OF A MODULATED PRIMARY BEAM

[75] Inventor: Hans D. Brust, Dudweiler, Fed. Rep. of Germany

[73] Assignee: Siemens Aktiengesellschaft, Berlin and Munich, Fed. Rep. of Germany

[21] Appl. No.: 251,371

[22] Filed: Sep. 30, 1988

[30] Foreign Application Priority Data

Sep. 30, 1987 [DE] Fed. Rep. of Germany ....... 3733112

[51] Int. Cl.$^5$ ............................................. G01R 31/26
[52] U.S. Cl. ........................... 324/158 R; 324/158 D; 250/310
[58] Field of Search ............... 324/158 R, 158 D, 71.3, 324/73 R, 73 PC; 250/310, 311

[56] References Cited

U.S. PATENT DOCUMENTS

| | | |
|---|---|---|
| 4,169,229 | 9/1979 | Feuerbaum . |
| 4,220,853 | 9/1980 | Feuerbaum et al. . |
| 4,220,854 | 9/1980 | Feuerbaum . |
| 4,223,220 | 9/1980 | Feuerbaum . |
| 4,227,679 | 7/1981 | Feuerbaum . |
| 4,292,519 | 9/1981 | Feuerbaum . |
| 4,539,477 | 9/1985 | Feuerbaum et al. ............ 324/158 R |
| 4,721,855 | 1/1988 | Fazekas ........................... 324/158 R |
| 4,745,362 | 5/1988 | Brust ............................... 324/158 D |
| 4,788,495 | 11/1988 | Plies ................................ 324/158 D |

FOREIGN PATENT DOCUMENTS

| | | |
|---|---|---|
| 0301254 | 2/1989 | European Pat. Off. ........ 324/158 D |
| DE3519392 | 12/1985 | Fed. Rep. of Germany . |
| DE3519401 | 12/1985 | Fed. Rep. of Germany . |

OTHER PUBLICATIONS

"Frequency Tracing and Mapping in Theory and Practice" by Brust et al., Apr. 24, 1985, pp. 299–321.
"Electron Beam Testing" by Wolfgang, Microelectronic Engineering 4, 1986, pp. 77–106.
"Voltage Coding: Temporal Versus Spatial Frequencies" by Lukianoff et al., Proceedings of the Eighth Annual Scanning Electron Microscope Symposium, 1975, pp. 465–472.

Primary Examiner—Gerard R. Strecker
Assistant Examiner—Edward Urban
Attorney, Agent, or Firm—Hill, Van Santen, Steadman & Simpson

[57] ABSTRACT

A method and apparatus provide compensation of frequency drift phenomenon of a signal to be investigated in an electron beam measuring unit. A regulating signal is acquired from the signal to be investigated and the modulation frequency ($f_b$) of a beam blanking generator in the electron beam measuring arrangement is modified therewith in accordance with the frequency drift in the investigated signal.

33 Claims, 2 Drawing Sheets

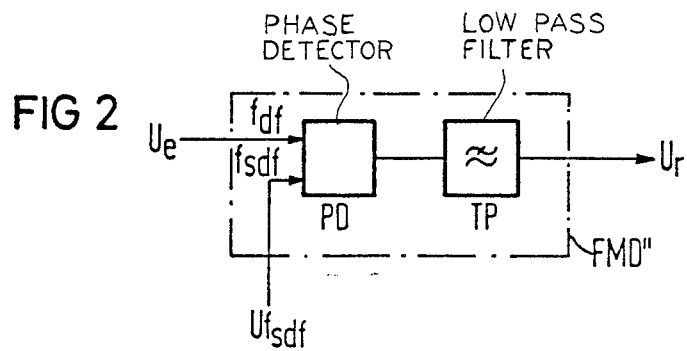
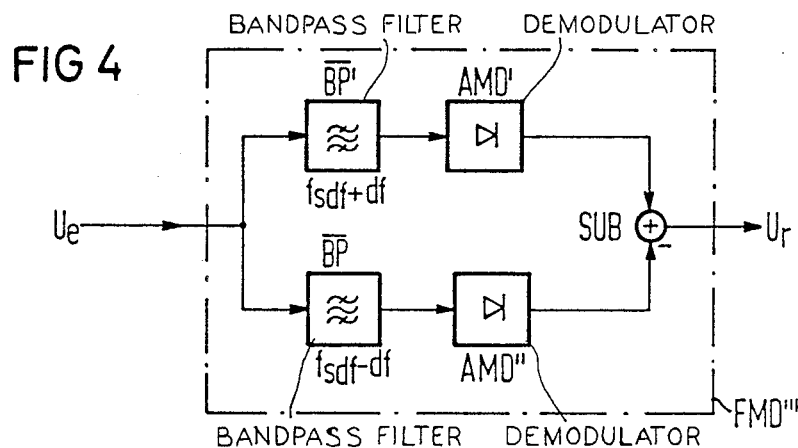
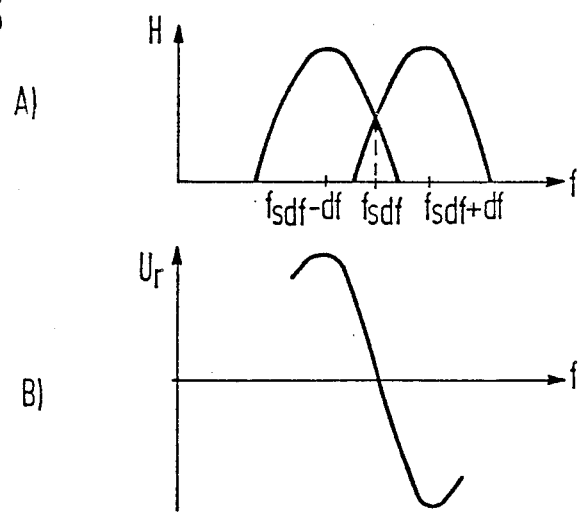

AUTOMATIC FREQUENCY FOLLOW-UP IN PARTICLE BEAM METROLOGY UPON EMPLOYMENT OF A MODULATED PRIMARY BEAM

BACKGROUND OF THE INVENTION

The present invention is directed to a method and to an apparatus for detection and/or imaging of a point of a specimen that carries a signal having at least one defined frequency. In particular, the present invention involves a method and apparatus for detection and/or qualitative and/or quantitative imaging at a point on a specimen that carries a signal having at least one defined frequency ($f_{ic}$), by a microscope in which the point is charged with a primary beam. A secondary signal is derived from the point, particularly via a detector and may be potentially further processed to a measured signal. The primary beam or a means for signal processing or the energy threshold of a spectrometer is modulated with a variable frequency ($f_b$). The frequency ($f_b$) differs from the defined frequency ($f_{ic}$). The secondary signal or measured signal derived therefrom is mixed onto a defined intermediate frequency ($f_{df}$). The secondary signal or measured signal is then demodulated.

Numerous methods are known in the prior art for acquiring the signal curves of high-frequency, periodic measuring signals with a particle beam or with the electron beam. A summary of test methods presently standard is reproduced in the publication "Micro Electronic Engineering", 1986, "Electron Beam Testing" by E. Wolfgang, pages 77 through 106, particularly on page 83. A distinction is made between measurements that occur in the time domain and those that occur in the frequency domain. Included in the first, for example, are "voltage coding" (also see "Scanning Electron Microscopy", 1975, (Part I), Proc. of the Eighth Annual Scanning Electron Microscope Symposium, Chicago, IIT Research Institute, pages 465 through 471) or "Logic State Mapping" (also see U.S. Pat. No. 4,223,220). Descriptions of "Frequency Mapping" or "Frequency Tracing" are included in the latter. In these latter two measuring methods, the electron beam is directed onto a measuring point and the frequency spectrum or an individual frequency component of the signal at the measuring point is measured.

German Published application No. 35 19 392 discloses a method wherein a signal component in the frequency domain is acquired with the use of an unmodulated primary electron beam. The frequency spectrum under consideration can be covered by a variation of the center frequency of a tuneable filter and, for an unknown frequency, the frequencies occurring at a measuring point of, for example, an interconnect in an integrated circuit, can be identified.

The fundamentals of the "Frequency Mapping" method are disclosed in the publication "Micro Electronic Engineering", Volume 2, No. 4, 1985, "Frequency Tracing and Mapping in Theory and Practice", by H. D. Brust and F. Fox, pages 304 through 311 and in German Published application No. 35 19 401 both hereby incorporated by reference. In "Frequency Mapping" or "Frequency Tracing", the beam blanking system does not have to be driven with short electrical pulses as, for example, in "Logic State Mapping"; rather, it is adequate to apply an alternating voltage having a defined frequency in order to modulate the primary beam. In principal, a drive with a purely sinusoidal voltage is also possible. A slight frequency offset of that frequency with which the primary beam is modulated relative to the frequency of the sought signal provides that the sought signal is always mixed onto a fixed intermediate frequency due to the interaction of the periodic event sequencing in the specimen with the primary beam. This fixed intermediate frequency can then be easily filtered out and subsequently demodulated. Since the signal chain of a scanning electron microscope need only transmit the relatively low, fixed intermediate frequency, extremely high-frequency signals can be delected or, imaged in a specimen. By wobbling that frequency with which the primary beam is modulated, the frequency spectrum under consideration can be swept and, for an unknown frequency of a sought signal, the frequencies occurring at a point of the specimen can thus be identified.

In contrast to most standard methods of electron beam metrology, the "Frequency Mapping" or "Frequency Tracing" method does not require any synchronization of the measuring equipment with the signals of the specimen to be investigated (for example, in an integrated circuit). Both are suitable for the investigation of asynchronous circuits. In these two methods, it is adequate that the frequency of the specimen differs from the sought rated frequency by not more than the band width of the intermediate frequency filter in the electron beam measuring instrument with a modulated primary electron beam.

The condition can be met relatively easily in the normal case. However, drift phenomena with respect to the frequencies to be investigated can occur in the circuits under investigation, for example for those having their own frequency generators. These drift phenomena can be due to temperature influences, for example, when the frequency on the specimen drifts away from the sought rated frequency by more than the intermediate frequency band width, then test results are no longer obtainable using "Frequency Tracing" and "Frequency Mapping" methods.

Since such drift phenomena usually occur relatively slowly, they can be compensated in the measuring instrument by manual adjustment of, for example, the frequency of the beam blanking generator. This, however, is usually an impediment in the examination and distracts from the actual subject of the examination.

SUMMARY OF THE INVENTION

An object of the present invention is to compensate drift phenomena in a frequency to be investigated in a measuring signal on a specimen without external manual operations.

This object is inventively achieved by a method which comprises the steps of acquiring a regulating signal from the secondary signal or the measured signal; and controlling the variable frequency ($f_b$) by the regulating signal such that the defined frequency ($f_{ic}$) and a predetermined rated frequency ($f_{sic}$) maximally differ by a first, predetermined difference frequency.

An apparatus for implementing the method has a beam blanking generator for driving a modulation system for modulation of the primary beam or for modulation of a mean for signal processing or for modulation of the energy threshold of a spectrometer with a variable frequency ($f_b$) that deviates from the defined frequency ($f_{ic}$). The apparatus also has an input of a FM demodulator connected to a signal chain at a location following a detector and preceding a unit for demodulation of the measured signal; and has an output of the FM demodulator connected to a control input of the generator for driving the modulation system for modulation of the primary beam or connected to a means for signal processing or to a spectrometer.

The advantages achieved with the present invention are provided by a method which is universally employable both for electrons, ions and particle radiation. It enables a deviation from the desired rated frequency to be compensated as long as the frequency does not drift quickly away and allows it to be investigated.

The specimen under test, for example, can be an integrated circuit. A periodic event respectively sequences in the integrated circuit under test, for example, a microprocessor repeatedly works off a program loop, so that electrical signals of different frequencies periodically occur on the interconnects of the integrated circuit. When such an interconnect is bombarded with a primary electron beam, then the primary electrons trigger low-energy secondary electrons when they impinge the specimen surface, these secondary electrons being extracted by a detector and being capable of being recorded. The secondary electrons are thereby influenced by the electrical fields above the specimen surface that are elicited by the electrical signals on the interconnect, an interaction that is referred to as voltage contrast.

Although the following exemplary embodiments are directed to an electron measuring instrument having a modulated primary electron beam, the invention is to be understood such that ions or other particles can also be used, instead of electrons, namely both as primary particles as well as secondary particles. In particular, photons also come into consideration as particles.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several figures of which like reference numerals identify like elements, and in which;

FIGS. 2, and 4 are block diagrams of an arrangement of an FM demodulator used in FIG. 1;

FIGS. 5A and 5B are graphs of the output characteristic of an FM demodulator according to FIG. 4.

DESCRIPTION OF THE PREFERRED EMBODIMENT

Figure 1:
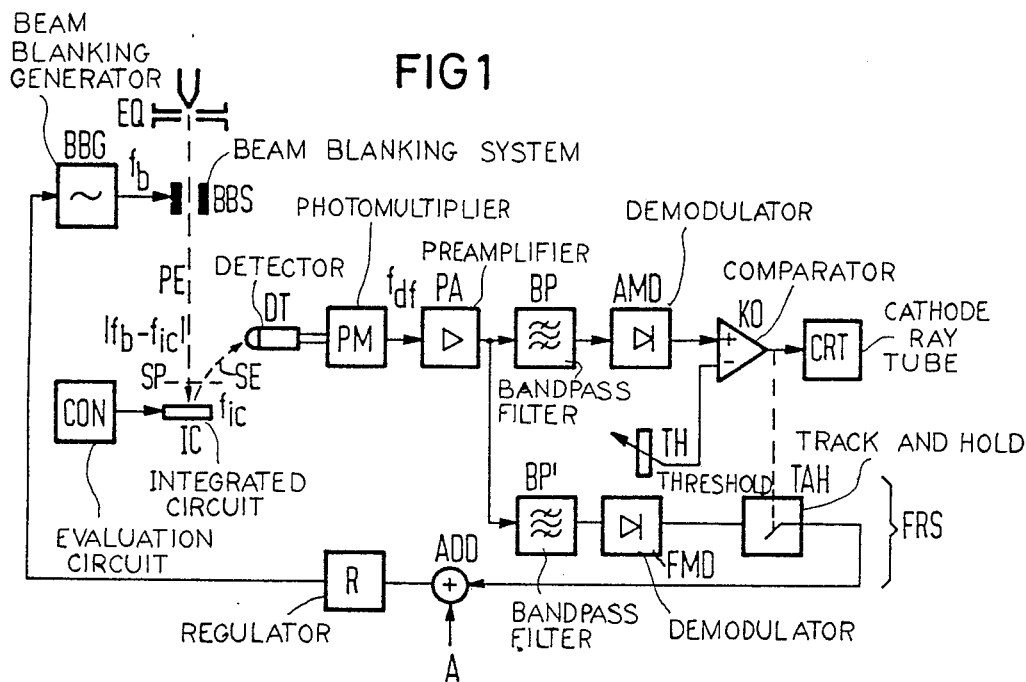
FIG. 1 is a block diagram of an arrangement of the present invention based on the frequency tracing method wherein drift phenomena of the frequency ($f_{ic}$) in the measuring signal of the specimen are compensated by modifiying the frequency at a beam blanking generator.

FIG. 1 shows an apparatus of the present invention for the detection and/or imaging of a measuring point that carries a signal having a defined frequency, with the use of a modulated primary beam (PE) and that is equipped with a frequency control circuit FRS. For example, a scanning electron microscope as disclosed by U.S. Pat. Nos. 4,220,853; 4,220,854 or, 4,277,679 for a quantitative voltage measurement and as disclosed by U.S. Pat. No. 4,223,220 for a qualitative voltage measurement can be used as basic equipment in the apparatus of FIG. 1. (U.S. Pat. Nos. 4,220,853; 4,220,854; 4,277,679 and 4,223,220 are hereby incorporated by reference.) In the apparatus of FIG. 1, of course, as in a method of the present invention, the integrated circuit IC can be replaced by an arbitrary specimen that has at least one measuring point that carries a signal having a defined frequency.

In an apparatus and in a method according to FIG. 1, the primary electron beam PE is modulated by a beam blanking system BBS having a defined frequency $f_b$. A suitable beam blanking system is disclosed, for example, by U.S. Pat. No. 4,169,229 (incorporated herein by reference). The beam blanking system BBS is driven with the frequency $f_b$ by a beam blanking generator BBG. The beam blanking system BBS can also be replaced by any other system that effects an intensity modulation of the primary electron beam PE. For example, the Wehnelt cylinder of the electron source EQ can be used. The frequency $f_b$ is offset by the frequency $f_{df}$ in comparison to the frequency $f_{ic}$ that a sought signal should exhibit at a measuring point. The quantity $f_{df}$ is equal to the absolute value of the difference between the quantities $f_b$ and $f_{ic}$. When the measuring point carries a signal having the frequency $f_{ic}$ and when the primary electrons are pulsed with the frequency $f_b$, the secondary electron signal ultimately processed via the detector DT and via the photomultiplier PM to the output of the pre-amplifier PA contains a signal having the frequency $f_{df}$. A band-pass filter BP following the pre-amplifier PA has the frequency $f_{df}$ as a center frequency. The band-pass filter BP therefore filters this frequency $f_{df}$ out of the frequency spectrum of the secondary electron signal. The part of the secondary electron signal that is allowed to pass through the band-pass filter BP is demodulated in an AM demodulator AMD and is subsequently applied to the positive input of a comparator KO. The negative input of the comparator KO is connected to a variable response threshold TH. The output of the comparator KO controls the intensity of the electron beam of a picture tube unit CRT that is a component part of the scanning electron microscope used in the apparatus according to FIG. 1. The x-inputs and y-inputs of the picture tube unit CRT can be connected to the position control of the primary electron beam PE. The movement of the write beam of the picture tube CRT then occurs synchronously with the movement of the primary electron beam PE and an image of the integrated circuit IC under test results. The integrated circuit IC is supplied with the required operating voltages and drive signals by drive and evaluation circuit CON.

Figure 3:
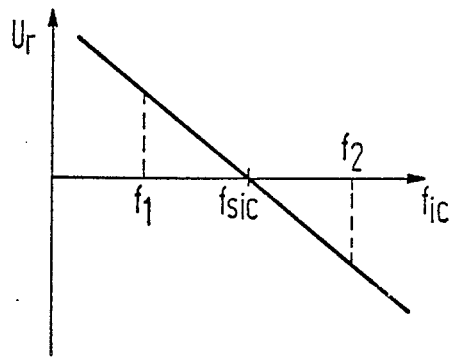
FIG. 3 is a graph of the output characteristic of an FM demodulator according to the arrangement of FIG. 2.

The frequency control circuit FRS of the present invention is composed of a band-pass filter BP', of a following FM demodulator FMD, of an adder ADD, of a regulator R and of a track and hold circuit TAH that is driven by the output signal of the comparator KO. The band-pass filter BP' that has its input connected to the point in the signal chain preceding the band-pass filter BP and following the pre-amplifier PA serves the purpose of improving the signal-to-noise ratio and is not absolutely necessary. In case the band width of the filter BP is great enough, for example, the band-pass filter BP can itself replace the filter BP'. In this case, the output signal of the band-pass filter BP is supplied to the FM demodulator FMD. The FM demodulator FMD connected to the band-pass filter BP', having a preferred embodiment as shown in FIGS. 2 and 4, supplies an output signal that indicates the deviation of the detected frequency from the rated intermediate frequency $f_{sdf}$ insofar as the detected frequency lies in a range ($f_{sdf}$+df, $f_{sdf}$−df). The frequency range of 2 df thereby indicates the minimum band width of the band-pass filter BP' or BP respectively and of the FM demodulator. FIG. 3 and FIG. 5 show characteristics of such FM demodulators having a curve of the output characteristic that is strictly linear at least in the sections of significance.

The output signal of the FM demodulator FMD is supplied to an adder ADD via a track and hold circuit TAH. The track and hold circuit TAH that is controlled by the output signal of the comparator KO in the embodiment shown in FIG. 1 always engages the frequency control circuit FRS when a signal of the frequency $f_{ic}$ having the rated frequency $f_{sic}$ is detected within a rigidly prescribed range of deviation. This range of deviation in this embodiment has a maximum which is the band width of the band-pass filter BP and which is otherwise determined by an appropriate dimensioning of the track and hold circuit TAH. When the band width of the filter BP is relatively small, then there is the risk that the frequency $f_{df}$ will move out of the capture range of the control too quickly It is recommended in such a case to allow the control of the track and hold circuit to occur via a second, broader-band filter, for example, via the band-pass filter BP'. To that end, the second band-pass filter is followed by a second AM demodulator whose output signal then controls the track and hold circuit TAH after comparison to a variable threshold. In the adder ADD, the output signal of the FM demodulator FMD forwarded via the track and hold circuit TAH is compared to a voltage signal that identifies the rated intermediate frequency of the integrated circuit $f_{sdf}$, being compared thereto for setting the operating point A. The comparison here occurs by adding in the adder ADD the negated voltage signal A to the output signal of the FM demodulator FMD. The control difference at the output of the adder is then supplied to a regulator R. The adder can be eliminated as an independent element when, for example, the control difference is determined in the regulator R itself or when the operating point is precisely zero volts.

For example, the regulator R can be a proportional regulator, an integral regulator or a proportional-integral regulator. The regulator output is subsequently connected to the beam blanking generator BBG in order to be able to influence the modulation frequency $f_b$. The output signal of the regulator R thus controls the output frequency $f_b$ of the beam blanking generator BBG. In case $f_b = f_{sic} + f_{dp}$ the regulating procedure is as follows: When the frequency $f_{ic}$ of the detected signal precisely corresponds to the desired rated frequency $f_{sic}$, than the modulation frequency $f_b$ is held constant; when, by contrast, it is lower than the desired rated frequency $f_{sic}$, then the modulation frequency $f_b$ is lowered by the frequency control circuit FRS and by the beam blanking generator BBG. In the inverse case, when the detected frequency $f_{ic}$ is greater than the rated frequency $f_{sic}$, the modulation frequency is increased (in case $f_b = f_{sic} - f_{db}$ the relations are vice versa. Analogous to the intermediate frequency $f_{df} = |f_b - f_{ic}|$, the rated intermediate frequency derives from $f_{sdf} = |f_b - f_{sic}|$, with $f_{sic}$ as the rated frequency. The sought frequency $f_{ic}$ that should correspond to the desired rated frequency $f_{sic}$ is not present everywhere in the integrated circuit IC. Its occurence is usually limited to a few interconnects. The track and hold circuit TAH is therefore used to investigate only those signals of the integrated circuit IC whose frequency $f_{ic}$ corresponds to the rated frequency $f_{sic}$ or that differ at most therefrom by a second, fixed predetermined difference frequency. For better adjustment the electron beam, after it has scanned a certain plurality of points (for example, a line or an entire frame), can skip to a defined point where the frequency $f_{ic}$ and the rated frequency $f_{sic}$ coincide and can be allowed to dwell briefly there for adjustment. In this case, the control of the track and hold circuit TAH should be coupled with the position control of the primary electron beam. Whenever the primary electron beam dwells on the comparison point, an adjustment of the center frequency must occur, i.e. the track and hold circuit must be switched into its tracking mode. It can otherwise be situated in its normal operating mode.

When, as disclosed, for example, by U.S. Pat. No. 4,292,519 (hereby incorporated by reference) a spectrometer SP is used in the arrangement of FIG. 1 for detection of the secondary electrons SE, then quantitative measurements can be carried out. When using such a spectrometer SP, frequencies defined in absolute numerical amplitudes in the frequency spectrum and that are identified at various measuring points can be additionally compared.

FIG. 2 shows a first structure of a FM demodulator FMD" for use as the FM demodulator FMD in the arrangement of FIG. 1. FIG. 2 shows a part of a phase locked loop circuit, having a phase detector PD and a following low-pass filter TP A mixer can be particularly utilized as the phase detector PD. The detected input signal $U_e$ having the intermediate frequency $f_{df}$ is compared to a reference signal $Uf_{sdf}$ having the rated intermediate frequency $f_{sdf}$, compared thereto in the phase detector PD. The output signal of the phase detector PD is supplied to a low-pass filter TP and the low-pass-filtered signal then serves as a control signal $U_r$. When the band width of the filter BP or of a "lock-in" amplifier LI is relatively small, there is the risk that the frequency $f_{ic}$ will move out of the capture range of the control too quickly. It is recommended in these cases to introduce a second, broader-band band-pass filter parallel to the band-pass filter BP and to derive the input signal of the FM demodulator FMD" from the output thereof. The structure of the circuit then corresponds to the embodiment shown in FIG. 1 The control of the track and hold circuit TAH can also be modified and coupled thereto or can be independent thereof. To that end, an AM demodulator is introduced following the second band-pass filter, the output signal of this AM demodulator, after comparison to a variable threshold, then controlling the track and hold circuit and thus determining when adjustment is carried out and when adjustment is not carried out.

FIG. 3 shows an output characteristic of the control signal $U_r$ dependent on the input intermediate frequency $f_{df}$ of the input signal $U_e$. The linearity of this characteristic is thereby less significant than the fact that it is strictly monotonous at least in sections, in this case proceeding in a strictly monotonously descending fashion.

When the input signal $U_e$ has the frequency $f_{df} = f_{sdf}$, i.e. has the rated intermediate frequency, then the control signal $U_r$ is equal to zero and no adjustment of the frequency $f_b$ of the beam blanking generator BBG in FIG. 1 occurs. The frequencies $f_1$ and $f_2$ in the output characteristic mark the corner frequencies of the band-pass filter BP' in the arrangement of FIG. 1 and indicate that drift phenomena of the intermediate frequency $f_{df}$ within the frequency range ($f_1-f_2$) can be compensated by the frequency control circuit FRS. A first, difference frequency of $|f_{df}-f_{sdf}|$ must thus always be lower than the difference between the corner frequencies $|f_1-f_2|$.

Whenever the detected input signal $U_e$ and the reference signal $Uf_{sdf}$ differ in frequency and, thus, in phase, the control signal differs from zero. The disadvantage of this rather simple circuit lies in that its control time constant is relatively long and the adjustment therefore occurs very slowly.

The second demodulator circuit FMD''' of FIG. 1 avoids this disadvantage but has a more complex structure (see FIG. 4). Two band-pass filters $\overline{BP}$, $\overline{BP}$, are used, their center frequency differing somewhat from the rated intermediate frequency $f_{sdf}$ (namely by $df<<f_{sdf}$). The input signal $U_e$ having the frequency $f_{df}$ is applied to the inputs of both band-pass filters. The output signal of the band-pass filters are each AM-demodulated in envelope demodulators AMD', AMD'' and are then subtracted from one another in a subtractor SUB. The signal acquired in this way serves as control signal $U_r$.

FIG. 5B shows the output characteristics of the demodulator circuit of FIG. 4 and FIG. 5A shows how it is realized. FIG. 5A shows the transfer function H(f) of the two band-pass filters having different center frequencies ($f_{sdf}+d_f$, $f_{sdf}-d_f$). A frequency characteristic $U_r(f)$ of FIG. 5B derives by subtraction of the two transfer functions. The same, strictly descending monotony of the output characteristics analogous to the output characteristic of FIG. 3 may again be seen within the frequency range $f_{sdf}-d_f$ through $f_{sdf}+d_f$. The adder can again be eliminated here since the optimal operating point of the circuit lies at zero (steepest region of the characteristic). The rated frequency $f_{sic}$ is determined by the center frequencies of the band-pass filters $\overline{BP}$ and $\overline{BP}$. When the control signal $U_r$ or the regulating signal that controls the output frequency $f_b$ of the beam blanking generator is entered over the time t or some other parameter that is significant for the frequency drift, for instance the temperature, then an automatic measurement of the frequency drift of an integrated circuit IC can be performed in this way.

The use of a spectrometer SP in the electron beam measuring arrangement according to FIG. 1 is useful not only for voltage measurement. When a constant voltage is applied to the retarding potential network of a retarding potential spectrometer, then the detector signal no longer occurs due to voltage contrast at the specimen surface but occurs due to the shift of the secondary electron energy distribution. Disturbing influences of local fields are thereby suppressed.

Further, other interactions can be exploited instead of the voltage contrast. Included therein, for example, are influencing the secondary electrons or photoelectrons generated by a primary electron beam or by a laser beam with a magnetic field. For instance, the movement of magnetic domains in the magnetic bubble memory could be investigated by using this "magnetic contrast".

The primary beam definitely need not be a particle beam; rather, it can also be composed of an arbitrary emission or radiation. When, for instance, a laser beam is used as the primary beam PE and an integrated circuit is again used as specimen IC, then the laser beam can generate electron-hole pairs and, thus, free charge carriers in the pn-junctions of the specimen IC. This is then expressed in a variation of the power consumption of the specimen IC. The size of this variation also depends on the switch condition of the respective pn-junction. A periodic change of the switch condition of a pn-junction could therefore be easily identified with a measurement of the supply current of the specimen IC. The supply current of the circuit or its difference from a quiescent current can directly serve as a measuring signal in this case; a separate detector is not required.

The mixing onto a fixed intermediate frequency is based on a non-linear switch characteristic produced by the pulsing of the primary electron beam. This, however, can also be achieved when the intensity of the secondary electrons or of the secondary electron signal is modulated instead of that of the primary electrons. This, for example, is possible in that the energy threshold of a retarding potential spectrometer is modulated with the frequency $f_b$. By taking the spectrometer characteristic into consideration, a sinusoidal modulation of the secondary electron signal can be achieved and potential difficulties with crossmodulation products as may occur in the described method under certain circumstances since the primary electrons, for example, can also be pulsed with square-wave signals can be avoided. Due to the higher capacitances that are to be charge-reversed and due to the energy dispersion of the secondary electrons, the limit frequency is lower when pulsing a means in the signal processing. Further, the spectrometer limits the field of vision. Analogously, the photomultiplier can also be operated together with a gate circuit or can be modulated in the video signal path. In this case, the band width, however, is greatly limited by the scintillator of the detector.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for at least one of detecting or imaging points on a specimen that carry a signal having a first frequency ($f_{ic}$), comprising the steps of:

directing a primary particle beam onto a point on the specimen;

deriving a first secondary signal from the point charged with the primary particle beam and generating a second secondary signal from said first secondary signal;

processing said second secondary signal into a measured signal;

modulating the intensity of at least one of the primary particle beam, the intensity of a beam of secondary particles triggered at the point on the specimen or the first secondary signal with a second frequency ($f_b$), whereby the second frequency ($f_b$) is not equal to the first frequency ($f_{ic}$);

filtering out a signal portion having an intermediate frequency ($f_{df}$) from the second secondary signal, whereby the intermediate frequency ($f_{df}$) corresponds to an absolute value of the difference between the first frequency ($f_{ic}$) and the second frequency ($f_b$);

identifying a deviation of the intermediate frequency ($f_{df}$) from a rated intermediate frequency ($f_{sdf}$) and acquiring therefrom a regulating signal for influencing the second frequency ($f_b$); and varying the second frequency ($f_b$) by means of the regulating signal until the intermediate frequency ($f_{df}$) deviates from the rated intermediate frequency ($f_{sdf}$) by less than a prescribed amount.

2. The method according to claim 1, wherein said second secondary signal is composed of an electrical signal.

3. The method according to claim 1, wherein said regulating signal is acquired from said signal portion by filtering and demodulation.

4. The method according to claim 3, wherein the demodulation occurs by phase comparison of the signal portion that is filtered out to a reference signal having a rated intermediate frequency ($Uf_{sdf}$) and thereafter low-pass filtering.

5. The method according to claim 3, wherein said signal portion is differently evaluated in two signal parts with two band-pass filters connected in parallel that have different center frequencies, $f_{sdf}+df$, and $f_{sdf}-df$, respectively and each of the signal parts being envelope-demodulated and the signal parts being subsequently subtracted from one another.

6. The method according to claim 1, wherein said regulating signal is compared to a signal of the rated intermediate frequency ($f_{sdf}$) for setting an operating point; and when the second frequency ($f_b$) is higher than the first frequency ($f_{ic}$) and the second frequency ($f_b$) derives as a sum of the first frequency ($f_{ic}$) and the intermediate frequency ($f_{df}$) or as a sum of a center frequency ($f_{sic}$) and the rated intermediate frequency ($f_{sdf}$), the second frequency ($f_b$) being increased when the intermediate frequency ($f_{df}$) is lower than the rated intermediate frequency ($f_{sdf}$), the second frequency ($f_b$) being decreased when the intermediate frequency ($f_{df}$) is higher than the rated intermediate frequency ($f_{sdf}$), the second frequency ($f_b$) being kept constant when the intermediate frequency ($f_{df}$) and the rated intermediate frequency ($f_{sdf}$) coincide.

7. The method according to claim 1, wherein said regulating signal is compared to a signal of the rated intermediate frequency ($f_{sdf}$) for setting an operating point; and, when the second frequency ($f_b$) is lower than the first frequency ($f_{ic}$) and the second frequency ($f_b$) derives as a difference between the first frequency ($f_{ic}$) and the intermediate frequency ($f_{df}$) or as a difference between a center frequency ($f_{sic}$) and the rated intermediate frequency ($f_{sdf}$), the second frequency ($f_b$) being decreased when the intermediate frequency ($f_{df}$) is lower than the rated intermediate frequency ($f_{sdf}$), the second frequency ($f_b$) being increased when the intermediate frequency ($f_{df}$) is higher than the rated intermediate frequency ($f_{sdf}$), the second frequency ($f_b$) being kept constant when the intermediate frequency ($f_{df}$) and the rated intermediate frequency ($f_{sdf}$) coincide.

8. The method according to claim 1, wherein the regulating signal controls the second frequency ($f_b$) when a signal having the first frequency ($f_{ic}$) is detected and thereby supplies an intermediate frequency ($d_{df}$) that maximally differs from the rated intermediate frequency ($f_{sdf}$) by a second, predetermined difference frequency.

9. The method according to claim 1, wherein the primary particle beam is directed to a comparison point on the specimen and an adjustment of the second frequency ($f_b$) is performed.

10. The method according to claim 1, wherein said second secondary signal is generated from said first secondary signal via a detector.

11. An apparatus for at least one of the detection, qualitative, or quantitative imaging of a point on a specimen that carries a signal having at least one defined frequency ($f_{ic}$) by a microscope having a primary beam source for emission of a primary beam, having a signal chin for processing a secondary signal that is derived from said point, whereby the signal chain has a detector and said apparatus has a means for registering the secondary signal processed by the signal chain, and has a beam blanking generator for driving a modulation system with a variable frequency ($f_b$) that deviates from the defined frequency ($f_{ic}$), comprising: an input of a FM demodulator connected to the signal chain at a location following the detector and preceding a unit for demodulation of the measured signal; an output of the FM demodulator connected to a control input of the beam blanking generator for driving the modulation system; a regulator located between the FM demodulator and the beam blanking generator; an output of the FM demodulator connected via an adder to the regulator; and the adder supplied with a signal for setting the operating point, being supplied therewith via a further input.

12. The apparatus according to claim 11, wherein said secondary signal is a measured signal.

13. The apparatus according to claim 12, wherein said measured signal is composed of an electrical signal.

14. The apparatus according to claim 11, wherein said regulator supplies a regulating signal to said beam blanking generator, said regulating signal being composed of an electrical signal.

15. The apparatus according to claim 14, wherein the regulator is a proportional regulator.

16. The apparatus according to claim 14, wherein the regulator is an integral regulator.

17. The apparatus according to claim 14 wherein a band-pass filter is connected proceeding the FM-demodulator for improving the signal-to-noise ratio.

18. The apparatus according to claim 14 wherein the FM-demodulator contains a phase detector having a following low-pass filter; and wherein the phase detector is supplied with the secondary signal on a first input and is supplied with a reference signal having the rated intermediate frequency ($f_{sdf}$) on a second input.

19. The apparatus according to claim 14 wherein the FM-demodulator contains two band-pass filters (BP, BP') having different center frequencies, two envelope demodulators and a subtractor; and wherein inputs of the band-pass filters are connected to an input of the FM-demodulator; and wherein each band-pass filter is connected via a respective envelope demodulator to the subtractor; and wherein an output of the subtractor forms an output of the FM-demodulator.

20. The apparatus according to claim 14, wherein said secondary signal is derived from said point into an electrical measured signal.

21. The apparatus according to claim 14, wherein the modulation system modulates the primary beam.

22. The apparatus according to claim 14, wherein the modulation system modulates a means for signal processing.

23. The apparatus according to claim 14, wherein the modulation system modulates the secondary current.

24. The apparatus according to claim 23, wherein the modulation of the secondary current is performed by modulating the energy threshold of a spectrometer.

25. The apparatus according to claim 11, wherein a band-pass filter is connected proceeding the FM demodulator for improving the signal-to-noise ratio.

26. The apparatus according to claim 11, wherein the output of the FM demodulator is connected via an adder to a means for signal processing; and wherein the adder is supplied with a signal for setting the operating point, being supplied therewith via a further input.

27. The apparatus according to claim 11, wherein the output of the FM demodulator is connected via an adder to a spectrometer; and wherein the adder is supplied with a signal for setting the operating point, being supplied therewith via a further input.

28. The apparatus according to claim 11, wherein a track and hold circuit is connected following the FM demodulator and preceding the regulator.

29. The apparatus according to claim 28, wherein the measured signal further-processed in the signal change from the secondary signal is connected to the track and hold circuit as control for the track and hold circuit, wherein a band-pass filter is connected proceeding the FM demodulator for improving the signal-to-noise ratio.

30. An apparatus for at least one of the detection, qualitative, or quantitative imaging of a point on a specimen that carries a signal having at least one defined frequency ($f_{ic}$) by a microscope having a primary beam source for emission of a primary beam, having a signal chain for processing a secondary signal that is derived from said point, whereby the signal chain has a detector and said apparatus has a means for registering the secondary signal processed by the signal chain, and has a beam blanking generator for driving a modulation system with a variable frequency ($f_b$) that deviates from the defined frequency ($f_{ic}$), comprising: an input of a FM demodulator connected to the signal chain at a location following the detector and preceding a unit for demodulation of the measured signal; an output of the FM demodulator connected to a control input of the beam blanking generator for driving the modulation system; a regulator located between the FM demodulator and the beam blanking generator; a track and hold circuit connected following the FM demodulator and preceding the regulator.

31. The apparatus according to claim 30, wherein the measured signal further-processed in the signal chain from the secondary signal is connected to the track and hold circuit as control for the track and hold circuit.

32. An apparatus for at least one of the detection, qualitative, or quantitative imaging of a point on a specimen that carries a signal having at least one defined frequency ($f_{ic}$) by a microscope having a primary beam source for emission of a primary beam, having a signal chain for processing a secondary signal that is derived from said point, whereby the signal chain has a detector and said apparatus has a means for registering the secondary signal processed by the signal chain, an has a beam blanking generator for driving a modulation system with a variable frequency ($f_b$) that deviates from the defined frequency ($f_{ic}$), comprising: an input of a FM demodulator connected to the signal chain at a location following the detector and preceding a unit for demodulation of the measured signal; an output of the FM demodulator connected to a control input of the beam blanking generator for driving the modulation system; a regulator located between the FM demodulator and the beam blanking generator; the output of the FM demodulator connected via an adder to a means for signal processing; and the adder supplied with a signal for setting the operating point, being supplied therewith via a further input.

33. An apparatus for at least one of the detection, qualitative, or quantitative imaging of a point on a specimen that carries a signal having at least one defined frequency ($f_{ic}$) by a microscope having a primary beam source for emission of a primary beam, having a signal chain for processing a secondary signal that is derived from said point, whereby the signal chain has a detector and said apparatus has a means for registering the secondary signal processed by the signal chain, and has a beam blanking generator for driving a modulation system with a variable frequency ($f_b$) that deviates from the defined frequency ($f_{ic}$) comprising: an input of a FM demodulator connected to the signal chain at a location following the detector and preceding a unit for demodulation of the measured signal; an output of the FM demodulator connected to a control input of the beam blanking generator for driving the modulation system; a regulator located between the FM demodulator and the beam blanking generator; the output of the FM demodulator connected via an adder to a spectrometer; and the adder supplied with a signal for setting the operating point, being supplied therewith via a further input.

* * * * *